United States Patent [19]

Thornton et al.

[11] Patent Number: 4,850,754
[45] Date of Patent: Jul. 25, 1989

[54] AUTOMATIC DRILLING MACHINE

[75] Inventors: Henry M. Thornton; John S. Thornton, both of Boxhill; Eugene A. Munchel, York, all of Pa.

[73] Assignee: Ashcombe Products Company, Dover, Pa.

[21] Appl. No.: 103,957

[22] Filed: Sep. 25, 1987

[51] Int. Cl.[4] .............................................. B23B 39/16
[52] U.S. Cl. ............................................ 408/35; 408/6; 408/43; 408/46; 408/53; 408/124; 408/702
[58] Field of Search ..................... 29/40; 408/124, 702, 408/6, 35, 42, 43, 46, 47, 53, 3, 4, 117, 31

[56] References Cited

U.S. PATENT DOCUMENTS

| 2,896,677 | 7/1959 | Payzant | 408/702 |
| 3,063,311 | 11/1962 | Beckwith et al. | 408/3 |
| 3,491,809 | 1/1970 | Schneider | 408/42 |
| 3,663,114 | 5/1972 | Welsch et al. | 408/4 |
| 4,054,975 | 10/1977 | Lundstrom | 408/35 |
| 4,182,205 | 1/1980 | Baker | 408/43 |
| 4,340,326 | 7/1982 | Buonauro et al. | 408/6 |

FOREIGN PATENT DOCUMENTS 2041591 2/1972 Fed. Rep. of Germany ........ 408/35

Primary Examiner—Joseph H. McGlynn
Assistant Examiner—Daniel W. Howell
Attorney, Agent, or Firm—C. Hercus Just

[57] ABSTRACT

A drilling machine operable to drill holes in desired patterns and diameters in circuit boards and similar items and the machine is provided with a base upon which a planar support is movable parallel to the base respectively in directions transverse to each other by power mechanism, an elongated support mounted above the planar support in parallelism therewith and at least one turret-like head is rotatable about the axis of and is supported by the elongated support. Power means are operable to move the elongated support and head perpendicularly toward and from the planar base and a plurality of drill heads respectively supporting bits of different diameters are connected to power means and are mounted radially upon the head in segmentally-spaced relationship to each other, power means are connected to the turret-like head and drill heads thereon and are operable to rotate the head to dispose a desired diameter of bit perpendicularly to the planar support, and computer-type control mechanism is connected to all the aforementioned power means to energize them in sequence and in a manner automatically to drill holes in a circuit board, when positioned upon the planar base, in a desired pattern and of selected diameters.

24 Claims, 6 Drawing Sheets

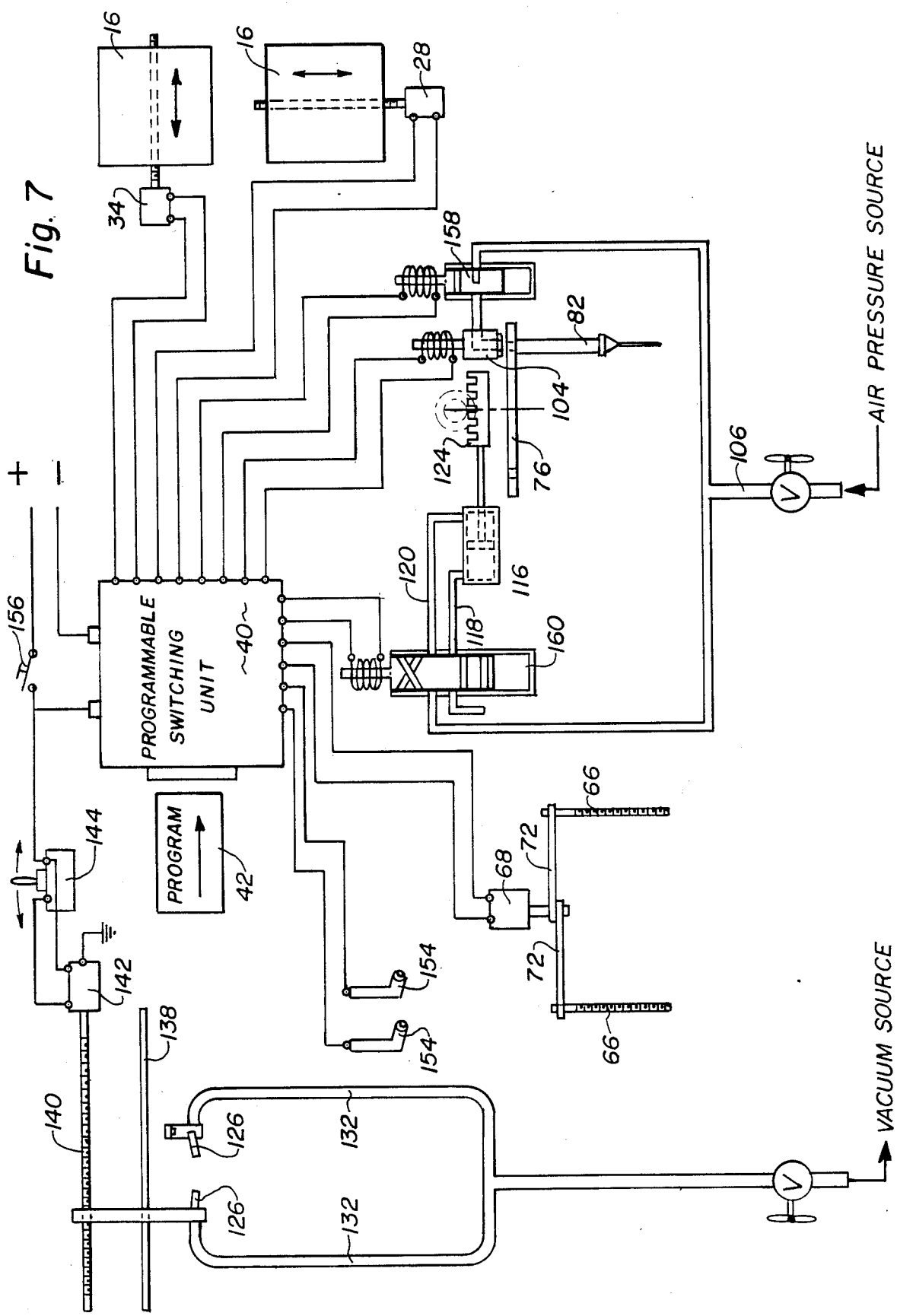

AUTOMATIC DRILLING MACHINE

BACKGROUND OF THE INVENTION

This invention pertains to an automatic machine for drilling desired patterns of holes of desired diameters, especially in sheet-like members of metal or otherwise and, more particularly, but without restriction thereto, for drilling precise patterns of holes of desired different diameters in circuit boards for electronic purposes.

So-called gang drills for simultaneously drilling a plurality of holes in various objects have been in existence for a long period of time, especially for eliminating the time required to drill individual holes by powered drills or otherwise.

An early example of a so-called turret-type drill head is the subject of prior U.S. Pat. No. 463,790, dated 1891, and in which six chucks for bits are mounted radially upon a base support and are rotatable to dispose a selected drill bit in drilling position relative to a workpiece.

A more recent turret-type drill head is the subject of prior U.S. Pat. No. 3,296,896, dated Jan. 10, 1967, and in which the turret is supported rotatably upon a head arranged for vertical movement relative to a stationary work support by means of a long screw which is power driven.

It also has been proposed to drill a pattern of holes in a flat object by the use of a template in which a desired pattern of holes has been formed which serve as guides for locating a drilling tool bit relative to a workpiece. An example of this type of drilling device is the subject of prior U.S. Pat. No. 3,532,893, dated Oct. 6, 1970.

The prior U.S. Pat. No. 3,663,114 to Welsh et al, dated May 16, 1972, is directed to a drilling machine particularly designed to drill holes in circuit boards and in which there is a flat support for the boards and power means are shown by which the support is moved in two relatively transverse directions to dispose the boards as desired relative to a pair of vertically-movable pairs of drill bits of fixed size and, if different sizes of bits are to be used, the machine must be stopped and the bits changed. The machine operation is effected by means of a control tape.

It also has been proposed in this type of art to dispose a flat piece to be drilled in a fixed position upon a base and by means of elongated screws which are transverse to each other, drill supporting heads are movable into desired relative positions so that when the unit which supports the heads is lowered, presumably a desired pattern of holes is drilled in the flat workpiece.

Although the foregoing designated patents have been selected from an extensive field of patents showing devices capable of drilling patterns of holes in many different ways, it is believed they are sufficiently representative of the prior art to appreciate the advantages thereover of the present invention, details of which are set forth below.

SUMMARY OF THE INVENTION

It is among the principal objects of the present invention to provide a drilling machine comprising a planar work-supporting base which is movable in two relatively transverse directions to shift the workpiece, as desired, relative to a drilling mechanism which includes a turret head upon which drill bits of different selected diameters are automatically moved, by rotation of the turret, to a drilling position and then the selected drill, which is power driven, descends to the workpiece to drill a hole automatically at a desired location in a prescribed computer-controlled position.

It is this new combination of elements which produces a new and improved drilling arrangement to produce not only a desired pattern of holes in a circuit board or the like, but a pattern of various diameters of holes if the same is desired, all controlled automatically by computer-type control for the power means which effect the desired movements of both the workpiece and the drill bits relative to each other.

It is another object of the invention preferably to provide power-operated screws by which the work support is moved in directions transverse to each other for positioning beneath a computer-controlled disposition of a selected drill bit supported on a rotatable turret and moved toward and from the workpiece by power-operated means connected to elongated screws.

A further object of the invention is to support one or more drill turrets upon an elongated member which is parallel to the support for the workpiece and the power means to move the drills toward and from the workpiece are adjacent opposite ends of said elongated member.

Still another object of the invention is to provide a circular disc-like turret upon preferably one face of which a plurality of power-operated drill heads are mounted radially in circumferentially-spaced positions relative to each other, and power means rotate said turret automatically to dispose a programmed drill head of selected diameter in drilling position perpendicularly to the plane of a workpiece.

One further object of the invention is to provide vacuum nozzle means operable adjacent each drill head and connected to a source of vacuum to remove chips from the workpiece as formed by the drilling operation.

Still another object of the invention is to provide adjacent each drill bit means to detect and signal the existence of a broken drill bit.

One further object of the invention is to provide the elongated support for the turret head in the form of a threaded shaft upon which a plurality of disc-like turrets are mounted a precise distance apart on the shaft in accordance with the spacing of a plurality of boards on a platter thereof and said discs are maintained in such precisely spaced positions by locknuts, for example, which are threaded upon said shaft and abutting opposite sides of said discs, and further to prevent rotational slippage between said shaft and discs, keyways and complementary keys are provided in said shaft and discs.

Details of the foregoing objects and of the invention are set forth below in the specification and are illustrated in the accompanying drawings comprising a part thereof.

BRIEF DESCRIPTION OF THE DRAWINGS

FIG. 7 is a power layout comprising a diagrammatic showing of the delivery of power to the various elements of the machine described in detail hereinafter.

DETAILED DESCRIPTION OF THE PREFERRED EMBODIMENTS OF THE INVENTION

Figure 1:
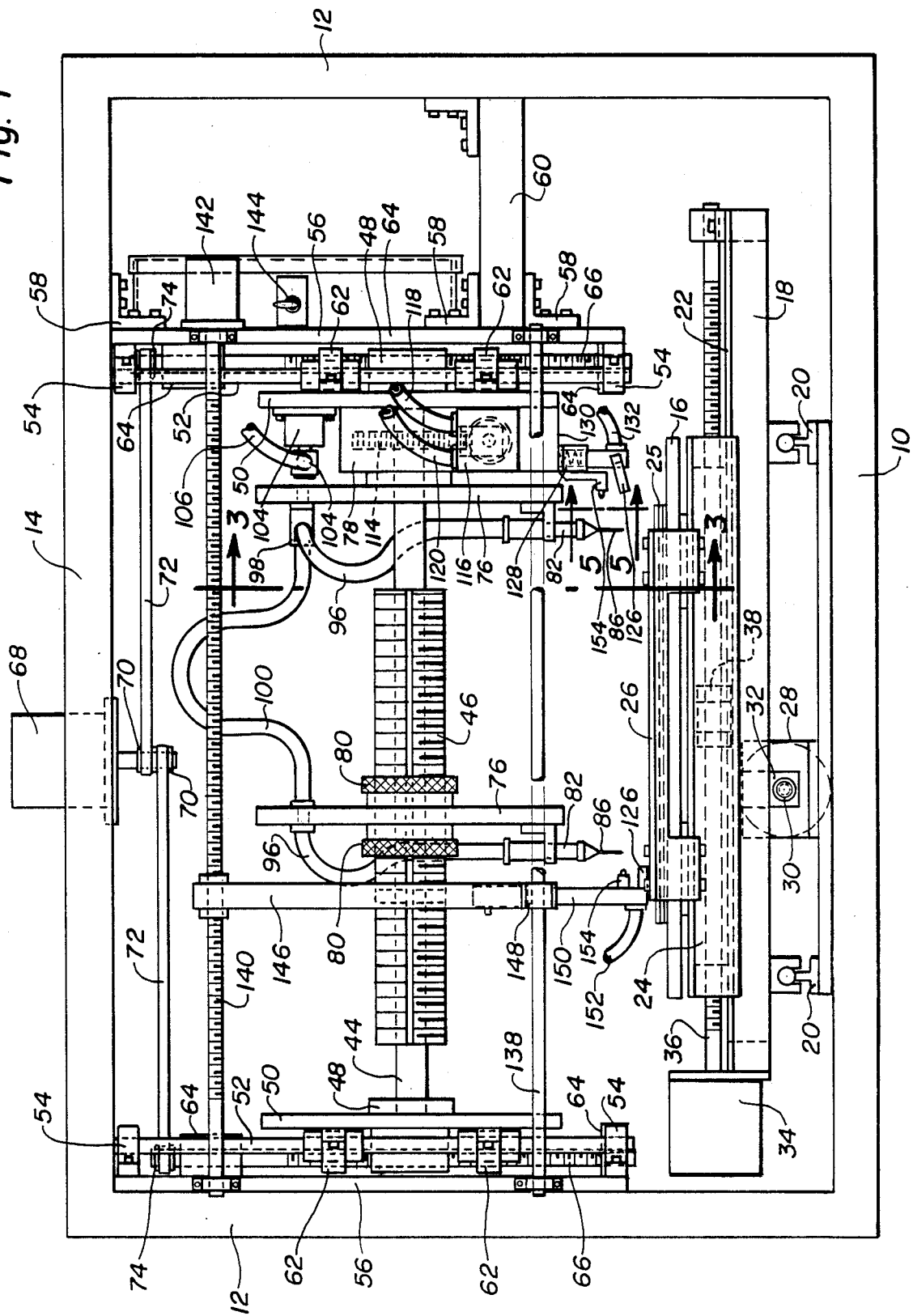
FIG. 1 is a side elevation of the machine embodying the invention.
Figure 2:
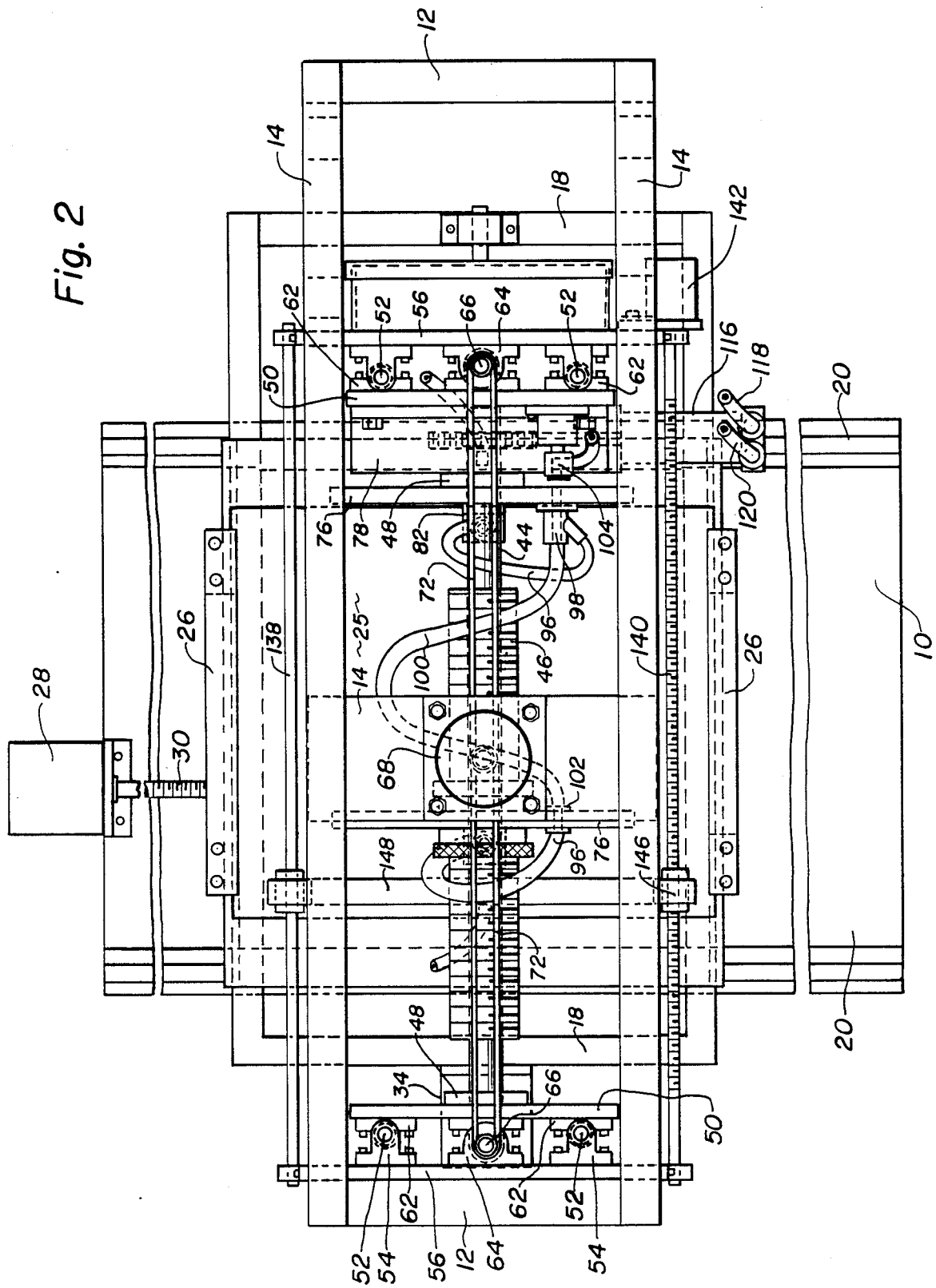
FIG. 2 is a top plan view of said machine.

Referring to FIGS. 1 and 2, there is shown therein a base frame member 10, from the opposite ends of which vertical frame members 12 project. The upper ends of the vertical frame members 12 support horizontal upper frame members 14, which are parallel to each other, as shown in FIG. 2. The lower portion of the frame assembly contains a planar work support 16 which is arranged for movement in two directions respectively at a right-angle to each other and commonly referred to as "X" and "Y" axes. To effect such movements, an intermediate member 18 is supported for movement in one horizontal direction upon a pair of spaced tracks 20, which are best shown in FIG. 1, and said intermediate member 18 includes a pair of parallel, transversely-spaced guide flanges 22 which are received in suitable grooves in another intermediate member 24 upon which the planar work support is affixed. Flat workpieces, such as a limited number of circuit boards 25, see FIG. 1, are mounted upon the work support 16 and clamped thereto by opposite clamp members 26.

To effect the above-described movement of the work support 16 upon the several supporting and guide means, a first power-operated member, such as electric motor 28, rotates a screw 30, which is threaded through a suitable dog 32 affixed to intermediate member 18. The dog 32 is threaded suitably to receive the screw 30 and the motor 28 is of reversible nature. Similarly a second power means, such as an electric motor 34, is supported at one edge of the intermediate member 18 and drives a screw 36 which is threaded through a dog 38, shown in phantom in FIG. 1, and affixed to the second intermediate member 24 for movement of the planar work support 16 in a direction at right-angles to that afforded by the motor 28. Referring to FIG. 7, it will be seen that power to the motors 28 and 34 is supplied to and controlled from a programmable switching unit 40, preferably of the computer-type, and into which a software program 42 is inserted, as shown in FIG. 7.

An elongated support shaft 44 has a threaded portion 46 intermediately of the ends thereof and the opposite ends of shaft 44 are mounted in bearing blocks 48. The bearing blocks 48 at opposite ends of the shaft 44 are fixed respectively to parallel plate-like members 50, which are arranged for vertical movement on pairs of parallel vertical guide rods 52 which, at the left-hand end of FIG. 1 are shown to be affixed to support blocks 54 affixed to the left-hand auxiliary vertical frame plate 56, as shown in FIG. 1. The opposite pair of guide rods 52 are affixed to support blocks 54 affixed to an auxiliary vertical frame plate 56, the upper end of which is secured by bracket 58 to the upper frame member 14 and the opposite end portion of frame plate 56 is attached by brackets 58 to a short horizontal cleat 60, which is affixed at its outer end to right-hand side frame member 12, as shown in FIG. 1.

The plate-like members 50 each have guide bearings 62 affixed thereto for slidable movement upon the transversely-spaced pairs of guide rods 52. Particularly from FIG. 1, it will be seen that the vertical frame plates 56 extend considerable vertical distances and at the upper and lower ends thereof, and as shown in FIG. 2, intermediately of the opposite side edges thereof, have bearing blocks 64 affixed thereto respectively for rotatably supporting the opposite ends of elongated vertical screws 66 which, respectively, are threaded through the bearing blocks 48 at opposite ends of the support shaft 44 and are reversely rotatable to move support shaft 44 toward and from the work support 16 while remaining constantly parallel thereto. Such rotation of the screws 64 is effected preferably by an electric motor 68 supported by the upper frame member 14 and provided with a pair of timing sheaves 70 on the shaft of the motor and around which a pair of timing belts 72 respectively extend from sheaves 70 to timing sheaves 74 on the upper ends of the screws 66. It will be seen, therefore, that the motor 68 rotates the screws 66 simultaneously and accurately in timed relationship to each other for raising and lowering the support shaft 44 as aforesaid.

Figure 3:
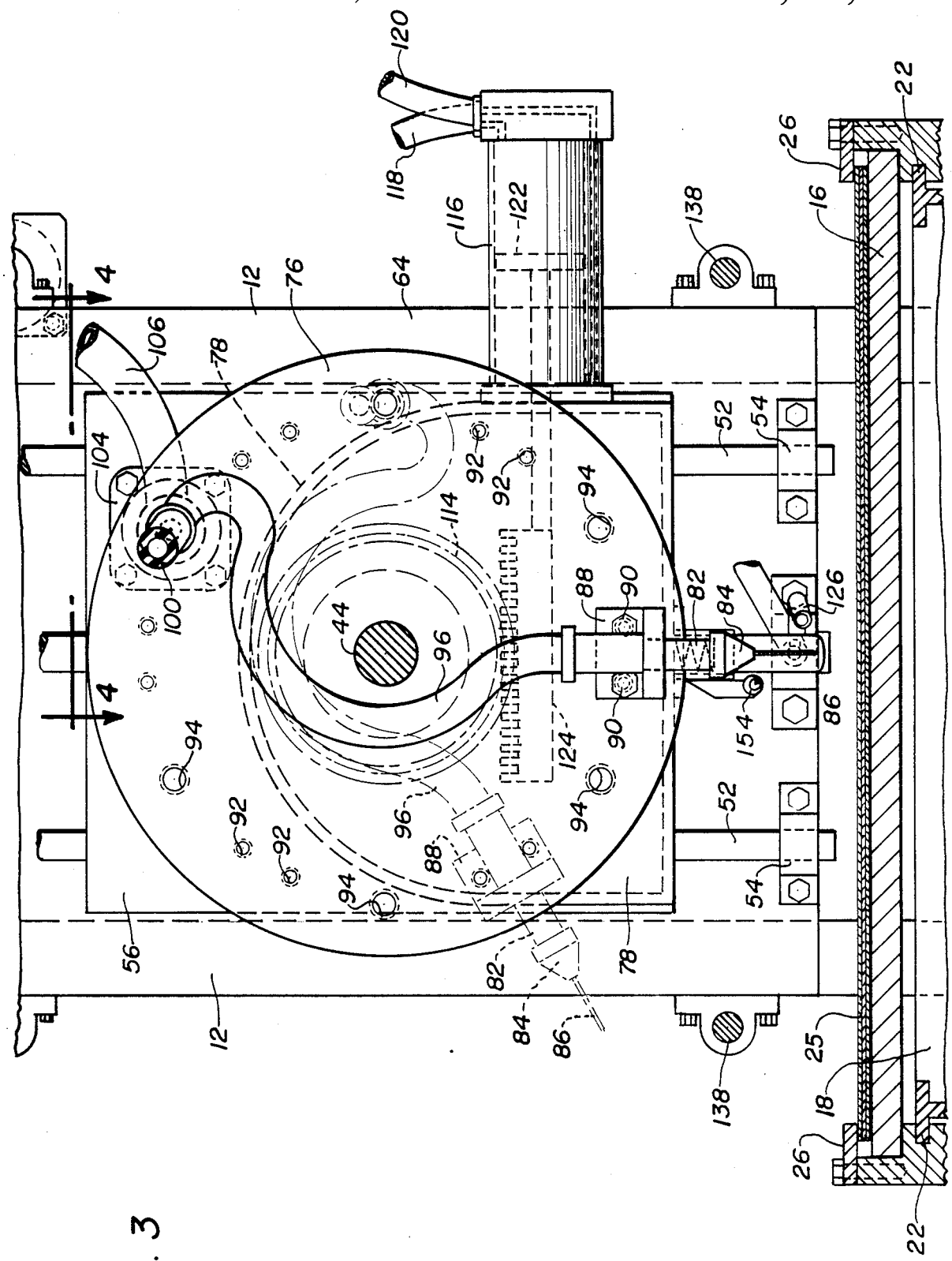
FIG. 3 is a vertical sectional view of one portion of the machine as seen on the line 3—3 of FIG. 1.
Figure 4A:
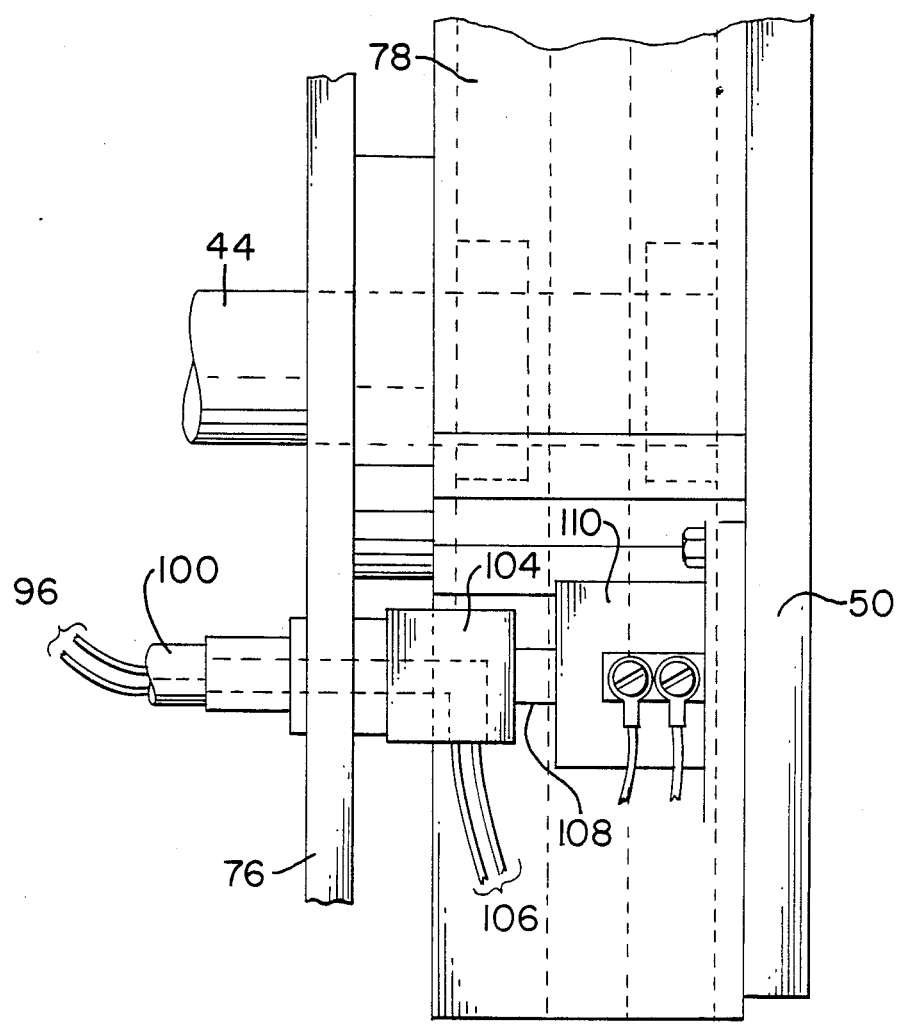
FIG. 4a is a detail of electrical power supply for electrically-powered drill heads.

The primary function of the support shaft 44 is to have at least one, and preferably a plurality, of a turret-like disc head 76, which for simple construction, comprises a disc and the same is fixed to the shaft 44 by key means or otherwise to prevent relative rotation between the head 76 and said shaft. From FIG. 1 it will be seen that one of the disc heads 76 is supported on the shaft adjacent a gear box 78, and a second disc head 76 is mounted upon the threaded portion 46 of shaft 44 for axial adjustment upon the same and secured in desired spaced relationship with respect to the right-hand disc head 76 by means of a pair of lock nuts 80. The purpose of the disc heads 76 is to support at least one, but preferably a plurality of drill heads 82, one of which is shown in full line in FIG. 3, and a second one in shown in circumferentially-spaced relationship thereto in phantom. By way of specific example, solely for illustrative purposes, the disc head 76 shown in enlarged manner in FIG. 3, is illustrated to support as many as six drill heads 82. The drill heads 82 have chucks 84 for purposes of receiving and clamping drill bits 86 to the heads. The drill heads 82 are secured to brackets 88 which, for example, may be secured to the disc head 76 by a pair of bolts 90, and it will be seen that the disc head 76 is provided with pairs of bolt-receiving holes 92 at various evenly circumferentially-spaced locations at the same radial distances from the axis of shaft 44 in order that as many as six drill heads, for example, may be supported by the disc head 76.

An important feature of the disc head 76 also is that it is provided with a plurality of apertures 94 at evenly-spaced circumferential distances upon the disc head 76. Apertures 94 may serve two purposes, for example, depending upon whether the drill heads 82 are to be operated by gas or air pressure, or by electricity. If they are to be operated by compressed air, for example, the drill heads 82 will comprise air turbines within the drill head that rotate the chucks 84 and drill bits 86. To provide driving air to the drill heads, a flexible conduit 96 is connected at one end to the upper end of the drill head 82, as shown in FIG. 3, and the opposite end is connected to a coupling 98, which is of a compound nature and is affixed at one end to one of the apertures 94 in disc head 76, while a supplemental conduit 100 extends to a complementary coupling 102 in the second disc head 76, as shown in FIG. 2, it being understood that the drill head will be in the same location on the second disc head as on the first-mentioned disc head, shown in FIGS. 1 and 2, respectively adjacent the gear box 78.

Figure 4:
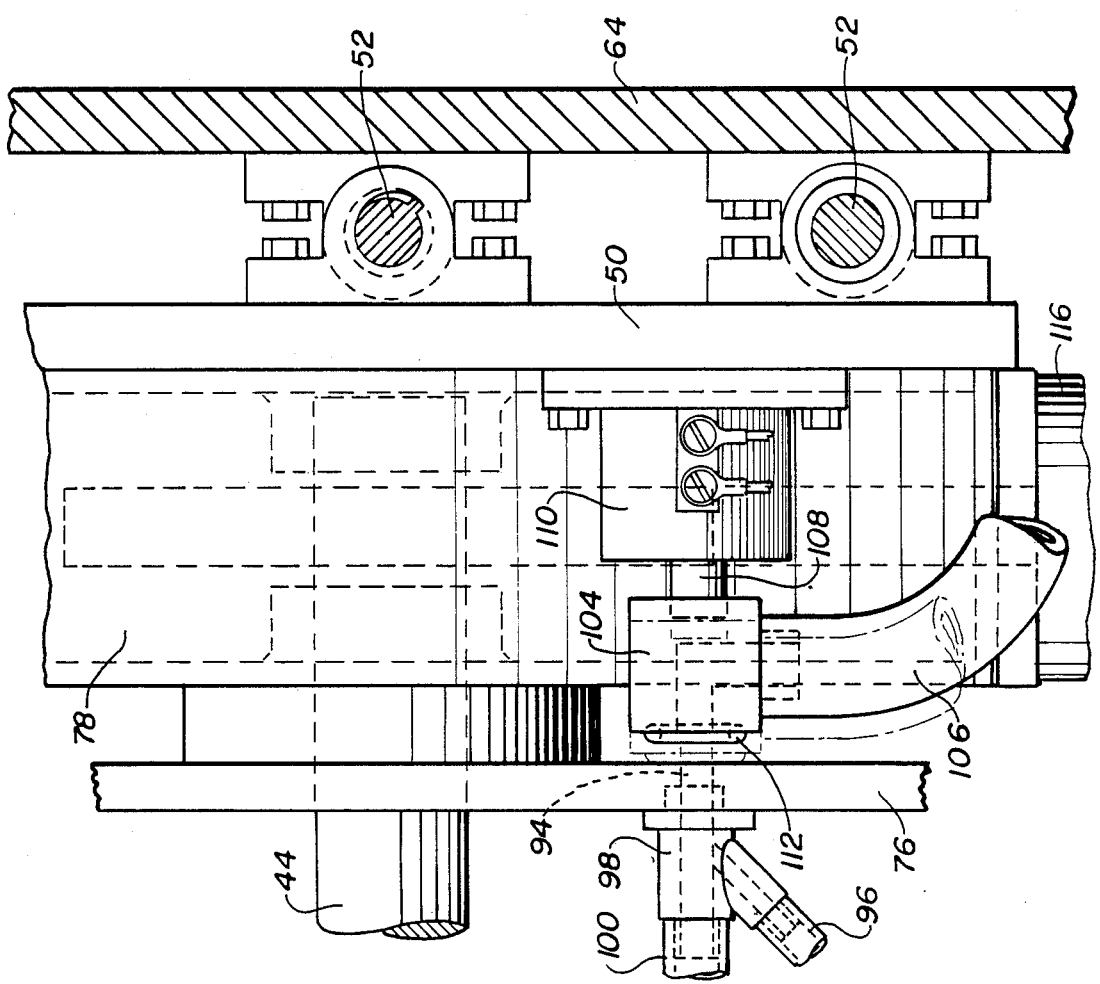
FIG. 4 is an enlarged fragmentary sectional view of the machine as seen on the line 4—4 of FIG. 3.

Referring particularly to FIGS. 1-4, it will be seen that the plate-like member 50 nearest gear box 78 is provided with a power discharge unit 104 which, if the operating power is compressed air, is connected to a compressed air supply conduit 106, best shown in FIGS. 3 and 4, and is mounted upon a shaft 108 of solenoid unit 110. Unit 104 comprises a head upon the shaft 108 and the face of the unit nearest the disc head 76 is provided with an O-ring 112 which is concentric with the aperture 94 through which compressed air is delivered to the conduit 96. It will be understood that the disc head 76 will have been moved to a rotary position in which the selected drill head 82 is in vertical position directly above the flat workpieces 24 into which it is to drill a hole. At that time, therefore, the disc head 76 is stationary and in accordance with timing supplied by the switching unit 40, shown in FIG. 7, solenoid unit 110 will be energized to move the head 104 to the left, as seen in FIG. 4, to firmly abut O-ring 112 against the face of disc unit 76, whereby air may be delivered to the conduit 96 for the operatively positioned drill head 82. From the foregoing, therefore, it will be seen that air will be supplied under pressure to the selected drill head and, in accordance with the operation of the switching unit 40, the screws 66 will be operated to lower the shaft 44 and one or more disc heads thereon to effect drilling of holes into the workpieces 25, whereby a similar hole will be drilled in each pattern of holes for, for example, a plurality of individual circuit boards arranged in a so-called platter thereof.

Under circumstances where the operation of the drill heads 82 is electrical, whereby small electric drills are affixed to the chucks 84 of the drill heads, flexible conduits 96 will be electrical, the power supply conduit 104 also will be electrical and connected at one end to a source of current of required power for the drill head, the apertures 98 will be contacts and the power discharge unit 104, which is connected to conduit 106, will also be electrical and abut the contact in aperture 94 with suitable insulation of known type being provided.

For purposes of indexing the individual drill heads 82 with respect to the workpiece 25, it being understood that each drill head will have a different diameter of drill bit therein, the gear box 78 contains a pinion gear 114, which is affixed by key means or otherwise to the support shaft 44. Referring particularly to FIG. 3, it will be seen that gear box 78 also has projecting therefrom a fluid-operated cylinder unit 116, which is connected at one end to a suitable source of operating fluid supplied, for example, by conduit 118 and returned by conduit 120. A piston 122 within the unit 116 is connected to a rack 124, which meshes with the pinion gear 114. Driving fluid for the piston 122 is supplied through conduit 118 under control of the program in the switching unit 40, whereby the drill head 82 with the desired size of bit 86 will be moved to operative position in which the bit is vertical to the plane of the workpiece 25. Such rotary movement of the disc head 76 is precise and serves to connect the coupling 98 on air supply conduit 96 with the air discharge unit 104 under circumstances where the drill heads 82 are operated by compressed air. Otherwise, the above-described electrical circumstances will be employed. Further, to insure precise movement of the drill bits 86 toward and from the workpieces 25, the guided movement of the bearing blocks 48 upon the guide rods 52 further contributes to accurately positioning the drill bits at the precise locations desired for drilling thereby in a workpiece 25.

Figure 5:
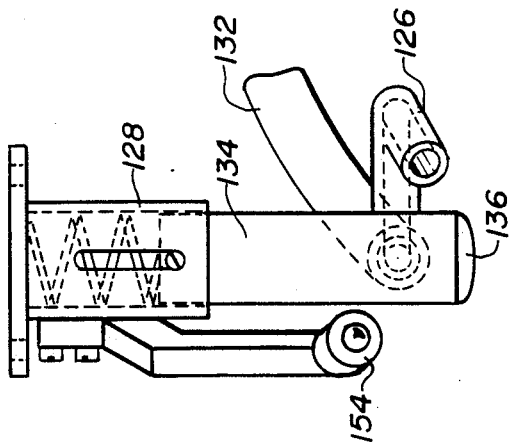
FIG. 5 is a fragmentary view of an element of the machine as seen on the line 5—5 of FIG. 1.
Figure 6:
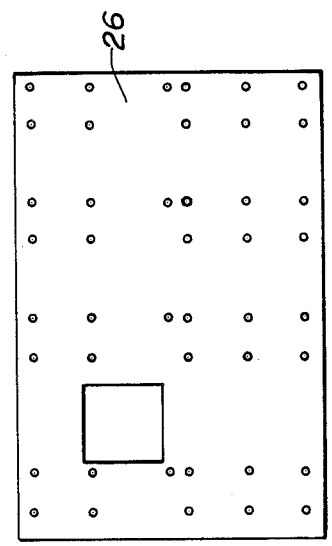
FIG. 6 is an exemplary flat workpiece, such as a circuit board having an exemplary arrangement of holes drilled therein, such as might be formed by the present invention.

It will be appreciated that especially where a substantial number of holes are required in order to form a precise pattern of various diameters of holes at specific locations, as is accomplished by the present invention, drilling chips occur and in order that the same will not interfere with successive drilling operations as the disc heads are lowered and raised, suitable means are provided to remove the chips expeditiously and effectively, preferably by means of vacuum nozzles 126, best shown in FIGS. 1, 3 and 5. The nozzle 126, which is adjacent the right-hand disc head as shown in FIG. 1, is supported by a bracket 128, see FIG. 5, which is affixed to the lower surface 130 of gear box 78. The suction nozzles 126 are directed closely toward the drill bits 86, as can be seen in FIG. 1, and a supply of suction is provided to the nozzles 126 by supply conduits 132, which are connected at one end to the nozzles 126 and at the opposite end to a source of vacuum, not shown. Referring to FIG. 1, it will be seen that when the gear box 78 is lowered at the time the drill bits are lowered for drilling operation, it is conceivable that the suction nozzle 126 will contact the workpieces 25 or the work support 16 before the drill bits 86 have been lowered into full drilling extent. Accordingly, if this occurs, the lower end 136 of spring-pressed plunger 134 will abut either the workpieces or the support 16 and permit the plunger 134 to move into the bracket 128 and thereby prevent damage of the suction nozzle 126.

Referring to FIG. 1, it will be seen that the suction nozzle 126 for the drill heads 82 that are connected to the disc heads 76 mounted intermediately of the ends of shaft 44 must be adjustable in order to accommodate the variable spacing which can be achieved, when necessary, between the several disc heads 76 contemplated for provision in the machine in order that a plurality of similar circuit boards, for example, may be drilled simultaneously and respectively in accordance with identical patterns and various diameters of holes. To accommodate such adjustability of the aforementioned disc heads 76, the suction nozzle 126 associated with the drill heads thereon also must be horizontally adjustable in the machine, and this is accomplished by extending between the auxiliary vertical frame plates 56 adjacent opposite ends of the machine, a plurality of guide rods 138 and an elongated screw 140, which is rotatable by means of still another electric motor 142, which is connected to a source of power and includes a manually-operated switch 144. A depending support member 146 has a bearing in its upper end which threadably engages the screw 140, while the lower end thereof is connected to one end of a horizontal cross piece 148 in an L-shaped configuration and including a guide bearing through which one guide rod 138 extends. This arrangement supports a spring-pressed, vertically-adjustable member 150, the lower end of which is affixed to the suction nozzle 126, as clearly shown in FIG. 1, and from which a suction conduit 152 extends.

The present invention also contemplates the inclusion of means to detect and automatically stop the operation of the machine when one of the drill bits 86 is broken. A number of commercial detection devices are available for this purpose, some of which are of an electric eye nature, and the present invention includes a suitable detection member 154, one of these being supported by vertically-adjustable member 150, and the other by bracket 128. These detection members are effectively connected to the switching unit 40, as shown in the diagrammatic layout in FIG. 7, and operate to stop the entire operation of the machine when a broken bit occurs in order to enable the broken bit to be replaced by a new one. Also shown in FIG. 7, the circuitry of the machine includes a master ON-OFF switch 156. Also, as shown in FIG. 7, the air pressure circuitry includes an ON-OFF solenoid control valve 158, which operates in the cycle to prevent air discharge when the drills are not operating. Further, in FIG. 7, control circuitry includes an index control unit 160 which is operated by the switching unit 40 respectively to effect the indexing of a desired drill to the drilling position thereof, as well as the control of air pressure to the drill heads which are operated by compressed air. Additional shut-off valves for both the vacuum source and air pressure source are clearly shown in the circuitry of FIG. 7.

From the foregoing, it will be seen that the present invention provides a compact machine for drilling automatically, as controlled by a programmable switching unit of computer-type, a pattern of holes of different diameters, when desired, simultaneously in a plurality of workpieces requiring the same pattern of holes but, for example, arranged in a platter containing a plurality of such patterns of holes and suitable supply of power and other energies to the drill heads and movement of the disc heads to which the drill heads are connected, is effected precisely and effectively. Removal of chips resulting from the drilling also is afforded by the machine, as well as the detection of any broken bit causes the machine to stop to enable the replacement of the same.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

I claim:

1. A machine designed to drill holes by automatic means in one or multiple circuit boards in a common plane, said machine comprising in combination,
   a. a planar support for circuit boards mounted upon a base provided with frame means extending upwardly therefrom and to which
   b. power means are connected and are operable to move said support within a plane parallel to said base in directions transverse to each other,
   c. an elongated support comprising a threaded shaft mounted above said planar support and parallel thereto and having positioning means upon said shaft,
   d. at least one rotatable head mounted upon said threaded shaft in abutment with said positioning means and operable within a plane respectively transverse to said planar and elongated supports, and including at least one lock nut on said shaft engaging said head to hold it firmly against said positioning means,
   e. a plurality of drill heads connected to power means to rotate bits thereon and said heads being mounted radially upon said rotatable head and operable to be disposed selectively in perpendicular positions above said planar support,
   f. power means operable to move said elongated support and drill heads thereon perpendicularly toward and from said planar support and operable to drill holes in circuit boards when positioned upon the same in accordance with desired patterns and selective sizes of holes to be drilled in said boards,
   g. power means operable to move said rotatable head to dispose a desired drill head in drilling position perpendicularly to said planar support above a circuit board to be drilled, and
   h. computer-type control means operable to control the operation of the foregoing power means in sequence to produce desired patterns and sizes of holes to be drilled in said boards.

2. The machine according to claim 1 in which said rotatable head is disc-like and said drill heads are fixed to one face thereof in desired circumferentially-spaced positions with respect to each other.

3. The machine according to claim 2 in which said drill heads each embody air-driven turbines and have means to be connected to a source of compressed air and including a shaft having a drill chuck fixed thereto at one end.

4. The machine according to claim 1 in which said drill heads each embody an electric motor having a shaft supporting a drill chuck and include means by which each motor is connected to a source of electric current.

5. The machine according to claim 1 in which said machine also includes a frame extending upward from said base and having end frame members at opposite ends of said base and an overhead member positioned above said elongated support and between said end frame members, said elongated support comprising a shaft provided at opposite ends with bearing blocks in which said shaft is rotatable and power-operated members extending downward from opposite ends of said overhead frame member and connected to said blocks and operable to move said support shaft toward and from said planar support, and pairs of vertical guide rods on said end frame members respectively at opposite sides of said power-operated members and operable to guide movement of said bearing blocks evenly.

6. The machine according to claim 5 in which said power-operated members comprise rods threaded through said bearing blocks and rotatably supported at the upper ends by bearings in said overhead member of said frame, and power means operably connected to said threaded rods to rotate the same simultaneously in a manner to move said elongated support shaft as aforesaid while constantly parallel to said planar support.

7. The machine according to claim 6 in which said power means comprises a motor supported by said overhead frame member and connected respectively to the upper ends of said threaded rods by pulleys and timing belts to rotate said shafts simultaneously as aforesaid.

8. The machine according to claim 1 further including vacuum nozzles mounted upon means supported by said frame means and positioned respectively adjacent said drill heads and including conduit means connected thereto and also connectible to a source of vacuum to remove chips drilled from holes formed thereby in each circuit board.

9. The machine according to claim 1 further characterized by said elongated shaft having another rotatable head thereon in spaced relation to the first head and said another head and shaft also being provided with a complementary keyway and key mounted therein to prevent relative rotation therebetween, and locknuts threaded upon said shaft adjacent opposite sides of said rotatable head to maintain the same in precisely desired spaced relationship.

10. The machine according to claim 9 further including a frame and bearing means interconnected to said frame and respectively supporting opposite ends of said elongated shaft, and power means connected to said shaft and operable to rotate said shaft through segmental intervals sufficient to position a desired diameter of drill bit in a selected drill head in drilling position perpendicular to and above said planar support.

11. A machine designed to drill desired patterns of holes of selected diameters in a flat workpiece and comprising in combination,
 a. a work support member mounted for movement in one direction upon an intermediate member which is movable relative to a fixed base and parallel thereto, the movements of the work support and intermediate member being transverse to each other,
 b. a frame supporting at least one disc-type turret-like head upon an elongated rotatable shaft positioned parallel to and above said work support,
 c. means operable by computer control means to move said rotatable shaft and turret-like head thereon toward and from said workpiece,
 d. at least one power-operated drill head carried by said turret-like head and fixed thereto for movement of a drill bit in said drill head relative to said workpiece when said turret-like head is rotated to position said head perpendicular to said workpiece,
 e. power means interconnected to said elongated shaft and operable to effect segmental rotation of said support shaft in accordance with said computer control means to dispose a desired drill head upon said turret-like head in operative position vertical to the plane of said workpiece, and
 f. means operable to adjust said disc-type turret axially along said rotatable shaft to desired positions of operation.

12. The machine according to claim 11 in which a plurality of drill heads are fixed upon one face of said disc-type turret in desired circumferentially-spaced positions at corresponding similar radial positions, flexible power-supplying conduits on said disc extending respectively between each drill head and one of a number of contacts on said disc corresponding to the number of drill heads, a relatively stationary power discharge outlet having a delivery head of limited projectability mounted adjacent said rotatably support shaft at a radial distance from said shaft equivalent to radial spacing of said contacts on said disc, and programmable means operable to project said delivery head into firm contact with a desired contact on said disc and thereby supply power to the drill head which is in selected operative position.

13. The machine according to claim 12 in which said programmable means to project said delivery head is a solenoid.

14. The machine according to claim 12 in which the power for said drill heads is electrical and the connectable means on said disc and said relatively stationary power discharge outlet are electrical.

15. The machine according to claim 12 in which the power for said drill heads is pneumatic and the connectable means on said disc and said relatively stationary power discharge outlet are abuttable faces.

16. The machine according to claim 12 in which said contacts on said disc are apertures extending therethrough at even radial distances to which one end of each flexible conduit respectively is connected and the inlet end of each aperture is flush with the face of the disc opposite that upon which said drill heads are mounted, and said relatively stationary power outlet of limited projectability is a discharge head connected at one end to the shaft of a solenoid and the opposite end of said head has a compressible O-ring thereon adapted to abut said opposite face of said disc firmly.

17. A machine designed to drill similar patterns of holes of selected diameters in a flat workpiece and comprising in combination,
 a. a base frame supporting guides respectively at a right-angle to each other and respectively superimposed to mount a planar work support to receive flat workpiece to have similar patterns of holes drilled therein,
 b. transversely-spaced vertical frame members extending upward from opposite ends of said base frame,
 c. similar pairs of vertically-spaced bearings supported by said vertical frame members,
 d. similar elongated screws respectively supported at opposite ends in said pairs of bearings,
 e. a pair of similar bearing blocks threaded respectively upon said screws and each block having a similar bearing therein transverse to said screws upon which said blocks are mounted, said bearings facing each other respectively for rotatable reception of
 f. opposite ends of an elongated support shaft,
 g. at least a pair of disc turret-type heads mounted concentrically upon said support shaft in spaced relationship and at least one of said turret-type heads having means for axial adjustment thereupon relative to the other head in accordance with the spacing of multiple patterns of holes to be drilled in a platter thereof,
 h. a similar plurality of drill heads respectively supported upon said disc heads radially and in similar circumferentially-spaced locations,
 i. power means operable to drive said drill heads respectively supporting bits of different diameters,
 j. plate-like members respectively at opposite ends of said support shaft and fixedly connected to said bearing blocks
 k. vertical guide rods fixed to said vertical frame members and said plate-like members being vertically slidable upon said guide rods and operable to prevent rotation of said bearing blocks,
 l. power means connected to said screws and operable to rotate said screws simultaneously to move said support shaft and disc heads thereon toward and from a workpiece, and
 m. means operated to rotate said support shaft as dictated by programmed control means to move other drill heads on said disc heads to vertical operating position relative to a workpiece.

18. The machine according to claim 17 in which said means to rotate said support shaft comprises a pinion gear fixed to said shaft and a fluid-operated rack meshing therewith, the operation of which rack is controlled by computer-type control means.

19. The machine according to claim 17 in which a motor is mounted upon an upper frame member supported upon the upper ends of said opposite end frame members, and timing belts extend at one end around timing sheaves on the shaft of said motor and the opposite ends of said belts extend around timing sheaves fixed respectively to one end of said elongated screws to rotate the same in unison.

20. The machine according to claim 17 further including suction heads mounted adjacent each drill bit when in drilling position vertically and means connecting said suction heads to a source of vacuum for removing chips drilled form said workpieces.

21. The machine according to claim 17 in which said drill heads comprise air turbines driven by compressed air and each of said disc heads have an aperture for each drill head, said machine further including an air conduit between each drill head and an aperture in said disc head related thereto, an air nozzle fixed to one of said plate-like members adjacent one end of said support shaft and connectable to a source of compressed air, the respective apertures in said disc heads for said drill heads being aligned with said air nozzle when the corresponding drill head is in vertical drilling position, and said air nozzle having a head arranged to be projected firmly against the positioned aperture in said disc head which is to deliver compressed air to the operatively positioned drill head.

22. A machine designed to drill holes of various different diameters in a workpiece and comprising in combination,
   a. a support upon which a workpiece is to be positioned for having holes of different diameters bored therein,
   b. a disc-type turret head mounted upon a shaft for rotation about an axis parallel to said support and having opposite faces thereon,
   c. means connected to said shaft and adapted to move the same vertically toward and from said support,
   d. a plurality of drill heads mounted upon one face of said disc-type turret head radially to said axis and circumferentially-spaced around said axis of said turret head,
   e. drill bits of different diameters chucked respectively upon said drill heads,
   f. a circular series of apertures formed in said turret head and respectively spaced circumferentially in accordance with the spacing of said drill heads and according to the number of said heads,
   g. a power head connected to a source of power and mounted stationarily with respect to said shaft and positioned adjacent the opposite face of said turret head in alignment with said circular series of apertures therein,
   h. means operable to rotate said turret head to index said drill heads operatively and respectively with the drill bits perpendicular to said workpiece,
   i. conduits respectively connected at one end to each drill head and the opposite ends connected to a corresponding aperture of said turret head, and
   j. means operable to position said power head firmly against each aperture as it is presented to said power head by rotation of said turret head when the bit of a drill head thereon has been indexed into operative drilling position perpendicular to said workpiece.

23. The machine according to claim 22 in which said source of power is compressed air and said drill heads are operated by said air pressure, said conduits are tubular to conduct said compressed air, said power head has a face provided with an O-ring, and said machine includes means to press said O-ring into firm concentric contact with said apertures as indexed thereto.

24. The machine according to claim 23 in which said means to press said O-ring into firm contact with said apertures comprises a movable plunger of limited projectable movement supporting said O-ring, and a solenoid projects said plunger toward said aperture.

* * * * *